United States Patent [19]

Ling

[11] Patent Number: 5,199,046

[45] Date of Patent: Mar. 30, 1993

[54] FIRST AND SECOND DIGITAL RATE CONVERTER SYNCHRONIZATION DEVICE AND METHOD

[75] Inventor: Fuyun Ling, Jamaica Plain, Mass.

[73] Assignee: Codex Corporation, Mansfield, Mass.

[21] Appl. No.: 756,741

[22] Filed: Sep. 9, 1991

[51] Int. Cl.⁵ ............................................. H04B 1/38
[52] U.S. Cl. ........................................ 375/8; 370/84; 341/61
[58] Field of Search ................. 375/7, 8, 106, 117; 370/84, 102, 108; 341/61

[56] References Cited

U.S. PATENT DOCUMENTS

| | | | |
|---|---|---|---|
| 4,411,006 | 10/1983 | Horna | 375/102 |
| 4,453,259 | 6/1984 | Miller | 375/106 |
| 4,460,890 | 7/1984 | Busby | 340/347 |
| 4,870,661 | 9/1989 | Yamada et al. | 375/122 |
| 4,953,180 | 8/1990 | Fieschi et al. | 375/7 |
| 4,989,221 | 1/1991 | Qureshi et al. | 375/8 |
| 5,060,239 | 10/1991 | Briscoe et al. | 375/106 |

OTHER PUBLICATIONS

"Optimum FIR Digital Filter Implementations for Decimation, Interpolation, and Narrow-Band Filtering", by Ronald E. Crochiere and Lawrence R. Rabiner, IEEE Transactions on Acoustics, Speech, and Signal Processing, vol. ASSP-23, No. 5, Oct. 1975.

"Digital Methods for Conversion Between Arbitrary Sampling Frequencies", by Tor A. Ramstad, IEEE Transactions on Acoustics, Speech, and Signal Processing, vol. ASSP-32, No. 3, Jun. 1984.

Primary Examiner—Stephen Chin
Attorney, Agent, or Firm—Darleen J. Stockley

[57] ABSTRACT

A first and second digital rate converter device and method provides for synchronization between a first digital sample sequence and a second digital output sequence related to the first digital sample sequence for a rate converter pair (501, 511; 601, 611). The method typically utilizes at least one of: queue monitoring and zero-crossing with resetting to minimize sampling timing error.

27 Claims, 5 Drawing Sheets

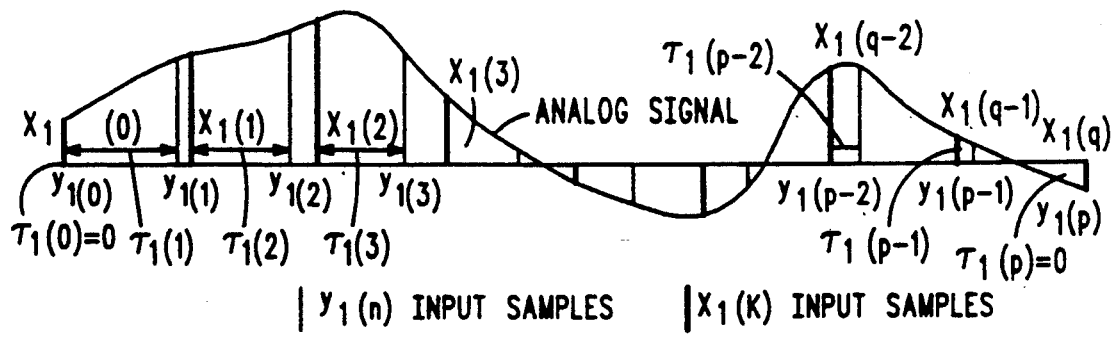
FIG. 1
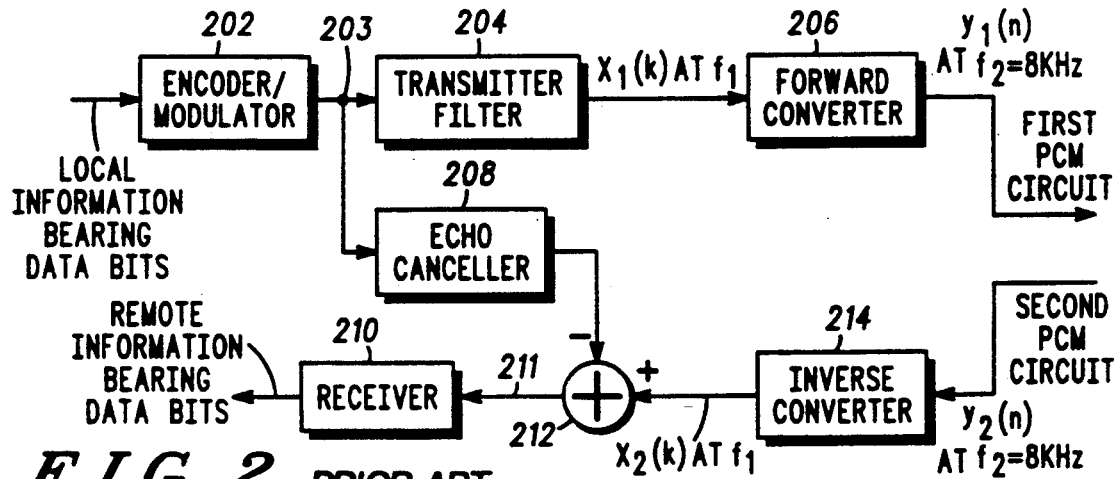
FIG. 2  PRIOR ART
FIG. 3  PRIOR ART
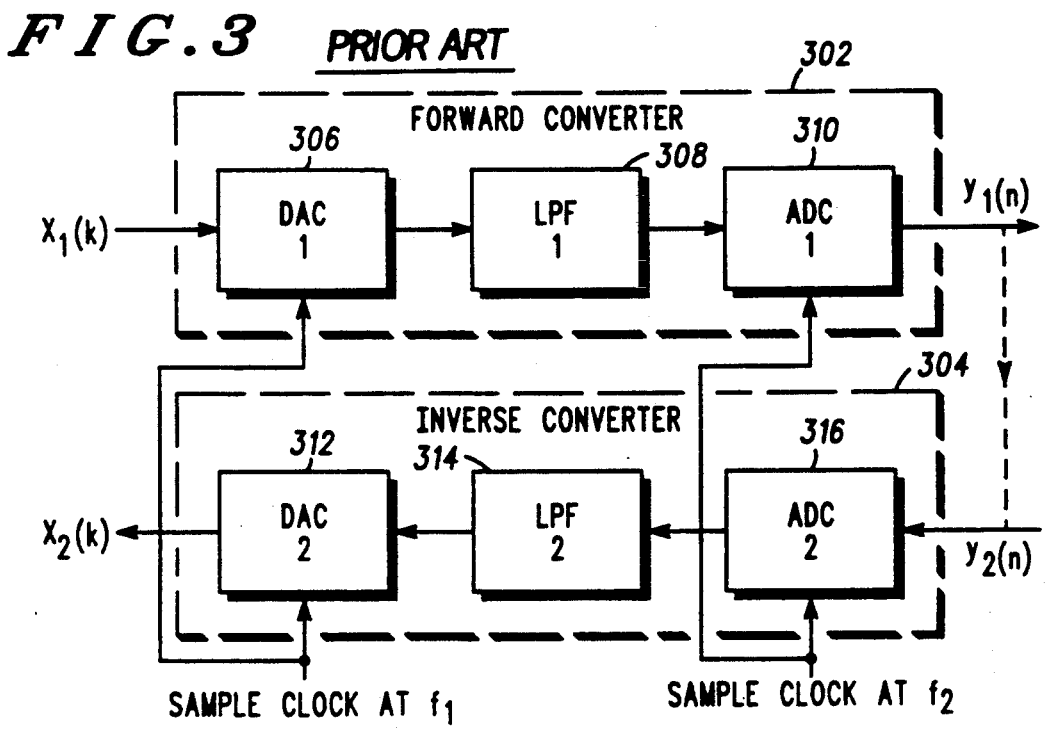

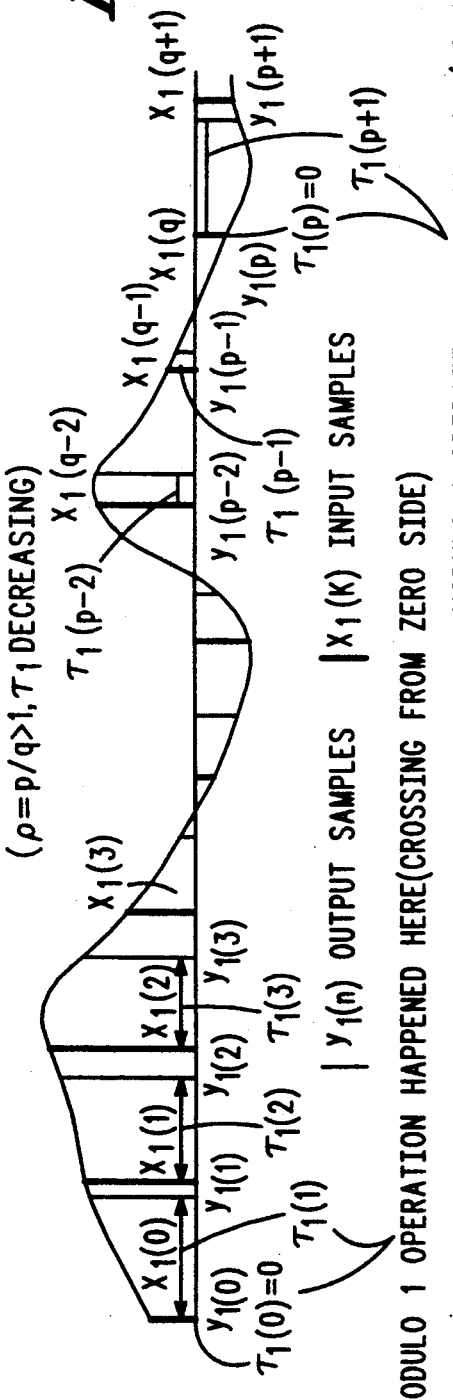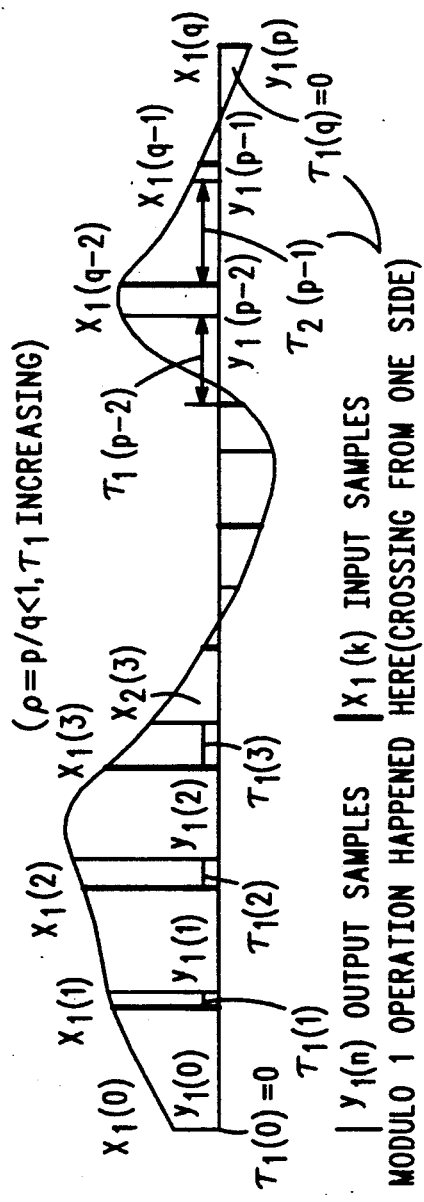

FIRST AND SECOND DIGITAL RATE CONVERTER SYNCHRONIZATION DEVICE AND METHOD

FIELD OF THE INVENTION

This invention relates generally to digital sampling rate conversion systems, and more particularly to synchronizing digital sampling rate conversion systems.

BACKGROUND OF THE INVENTION

Various analog sampling rate conversion schemes that utilize a resampling approach are known in the art. Typically, a first (forward) digital-to-analog converter (DAC1) converts input data $x_1(k)$ to an analog form at a rate $f_1$, a sample clock rate of $x_1(k)$. An output of DAC1 is then passed through a low-pass filter (LPF1) to remove high frequency components, the output of the LPF1 further being sent to a first analog-to-digital converter (ADC1) and sampled at a second rate $f_2$, thereby generating digital samples $y_1(n)$.

An inverse converter almost identical to the forward converter, typically a second digital-to-analog converter (DAC2), converts a digital sample sequence $y_2(n)$ that is synchronous with $y_1(n)$ to an analog form at a clock rate of $f_2$. An output of DAC2 is generally passed through a second low-pass filter (LPF2), and the output of that LPF2 is converted by a second analog-to-digital converter (ADC2) to a digital sequence $x_2(k)$ at a rate of $f_1$. Where ADC2 is controlled by the same clock of $x_1(k)$, the ADC1 and DAC2 are operated with a clock that is synchronous with the sample clock, sequences $x_1(k)$ and $x_2(k)$ are synchronous, and rate conversion is linear and time-invariant.

It has been shown that an analog rate converter substantially comprising a DAC-LPF-ADC may be realized digitally. Hence, a pair of digital rate converters may be utilized to form forward-inverse rate conversion, allowing reduction of the number of required analog components and concomitant costs for rate conversion devices.

However, since accuracy of input/output sampling rates and conversion ratios may vary with time and accuracy of digital number representations typically involve at least some degree of imprecision, exact synchronization between $x_1(k)$ and $x_2(k)$ in sampling timing is typically a problem where digital rate converters are implemented.

SUMMARY OF THE INVENTION

A digital synchronization device and method are provided for at least partially synchronizing at least first and second digital rate converters (DRCs), the first DRC having an input of at least some first digital sequence samples $\{x_1(k)\}$ sampled at a first sampling rate and the second DRC having an input of at least some second digital sequence samples $\{y_2(n)\}$ related to the first digital sequence samples and sampled at a second sampling rate different from the first sampling rate, wherein: the first DRC comprises at least: a first buffer, operably coupled to receive the first digital sequence samples $\{x_1(k)\}$, for delaying and temporarily storing the first digital sequence samples $\{x_1(k)\}$; a first digital resampler having at least a first delay unit, operably coupled to the first buffer, for shifting the first digital sequence samples into the first delay unit and for generating first output digital sequence samples $\{y_1(n)\}$ at substantially the second sampling rate utilizing a first selected sample timing in accordance with a first shift control signal $m_1(n)$ and a first desired normalized timing offset $\tau_1(n)$; and a first variable delay generating unit having a nominal normalized timing input $\Delta\tau_1(n)$, $\Delta\tau_1(n)$ being a first sampling time advance, and being operably coupled to the first digital resampler, for providing the first desired normalized timing offset $\tau_1(n)$ and for providing the first shift control signal $m_1(n)$ determined from a previous normalized timing offset $\tau_1(n-1)$; and the second DRC comprises at least: a second buffer, operably coupled to receive the second digital sequence samples $\{y_2(n)\}$ related to the first digital sequence samples $\{x_1(k)\}$, for at least delaying and temporarily storing the second digital sequence samples $\{y_2(n)\}$ and providing the delayed, temporarily stored samples to a second digital resampler; a second digital resampler having at least a second delay unit, operably coupled to the second buffer and to a second variable delay generating unit, for shifting the second digital sequence samples into the second delay unit and for generating second output digital sequence samples $\{x_2(n)\}$ at substantially the first sampling rate utilizing a selected sample timing in accordance with a second desirable normalized timing offset $\tau_2(k)$, and a second shifting control signal $m_2(n)$ from the second variable delay generating unit, the second variable delay generating unit having a nominal normalized timing input $\Delta\tau_2(k)$, $\Delta\tau_2(k)$ being a second sampling time advance, and being operably coupled to the second digital resampler, for providing the second desired normalized timing offset $\tau_2(k)$ and for providing the second shift control signal $m_2(n)$ determined from a previous normalized timing offset $\tau_2(n-1)$, the second variable delay generating unit being operably coupled at least to the second digital resampler, for providing shift and timing information in accordance with a second sampling time advance $\Delta\tau_2(k)$, such that timing differences between the first digital sequence samples and the second output digital sequence samples are substantially detected and variations in the timing differences are substantially reduced.

One exemplary embodiment provides additionally that one of: the second buffer is further operably coupled to the second variable delay generating unit for providing a first feedback signal for queue-depth monitoring; and an output buffer of the second DRC being operably coupled to the second variable delay generating unit for providing a second feedback signal for queue-depth monitoring. Thus, the second variable delay generating unit provides shifting and timing information utilizing at least queue-depth monitoring for monitoring a depth of at least one of: an output buffer of the second output digital sequence samples $\{x_2(k)\}$, and an input buffer of the second digital sequence samples $\{y_2(n)\}$. Typically, for a desired queue-depth D and a selected buffer being one of: the input buffer of $\{y_2(n)\}$ and the output buffer of $x_2(k)$, the second variable delay generating unit further provides for: where the queue depth of the selected output buffer is greater than D, generating the second output digital sequence samples $\{x_2(k)\}$ at a rate smaller than the first sampling rate; where the queue depth of the selected output buffer is less than D, generating the second output digital sequence samples $\{x_2(k)\}$ at a rate greater than the first sampling rate; where the queue depth of the selected input buffer is greater than D, generating the second output digital sequence samples $\{x_2(k)\}$ at a rate greater than the first sampling rate; and where the queue depth of the selected input buffer is less than D, generating the second output digital sequence samples $\{x_2(k)\}$ at a rate smaller than the first sampling rate.

Another exemplary embodiment, providing greater synchronization, further includes at least a zero-crossing checking and resetting unit, operably coupled to the first variable delay generating unit and to the second variable delay generating unit, for zero-checking the normalized timing offset $\tau_1(n)$, such that, for providing shifting and timing information for a first digital rate converter having a first conversion ratio $\rho$: the first digital rate converter is initialized to a normalized timing offset of $\tau_{init}$; the second digital rate converter is initialized to a normalized timing offset of $(1-\rho\tau_{init})$-modulo 1; and where zero-crossing occurs, the zero-crossing checking and resetting unit resets a second normalized timing offset $\tau_2(k)$ to: substantially $1-\rho\tau_1(n)$ where $\tau_1(n)$ is close to zero (crossing from one-side); and substantially $\rho[1-\tau_1(n)]$ where a normalized timing offset $\tau_1(n)$ is near one (crossing from zero side).

All modifications within the spirit and scope of the invention are intended to be included as defined in the appended claims.

BRIEF DESCRIPTION OF THE DRAWINGS

FIG. 1 illustrates a timing diagram of a typical digital rate conversion.

FIG. 2 is a block diagram of a pulse code modulation (PCM) echo cancellation modem having a pair of forward and inverse analog rate converters as is known in the art.

FIG. 3 is a block diagram of a forward and inverse digital rate converter system that implements analog interpolation as is known in the art.

FIG. 7A and 7B depict a first set of timing diagrams illustrating the zero-crossing and modulo operations in offset timing: for a rate converter frequency ratio $p/q > 1$, p and q being integers, wherein converter timing offset is decreasing (7A); and for a rate converter frequency ratio $p/q < 1$ wherein converter timing offset is increasing (7B), respectively.

DETAILED DESCRIPTION OF A PREFERRED EMBODIMENT

Figure 4A:
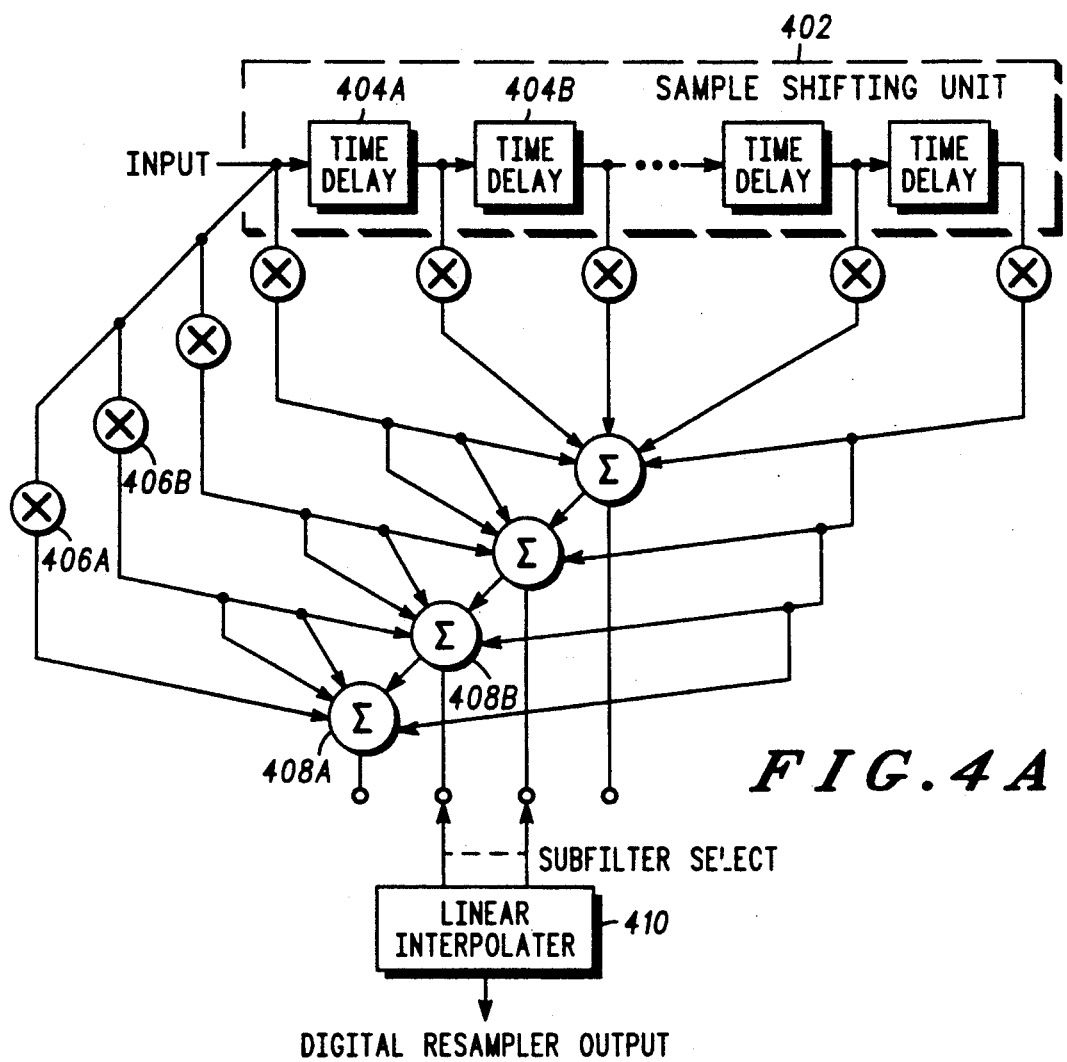
FIG. 4A is a block diagram of a digital resampler with a linear interpolator adapted for use in the present invention.

Where a first digital converter converts a digital sequence $\{x_1(k)\}$ into another sample sequence $\{y_1(n)\}$ with a different sampling frequency from $\{x_1(k)\}$, and a second digital rate converter converts a digital sample sequence $\{y_2(n)\}$, which is related to $\{x_1(k)\}$ and is synchronous to $\{y_1(n)\}$, into a sample sequence $\{x_2(k)\}$, the present invention substantially provides for timing synchronization between the first and second digital rate converters. Such synchronization, a matching in sample timing in addition to a matching of average frequency for a pair of first and second digital rate converters, is critical in implementing a rate converter pair. For example, in a pulse code modulation (PCM) echo cancellation modem, where a channel is time-varying as echo path rate converters often have overall time-varying delay, which tends to degrade performance of echo cancellation.

Thus, the present invention fills a need by providing a device and method that reduce timing error for first and second digital rate converters.

FIG. 1 illustrates the timing diagram of a typical digital rate converter. A digital rate converter converts a first digital sample sequence $\{x_1(k)\}$ at a first sampling rate $f_1 = 1/T_1$, into a second digital sample sequence $\{y_1(n)\}$ at a second sampling rate $f_2 = 1/T_2$. T1 and T2 are selected time delays. Where these sequences are viewed as though they were generated by sampling a common analog signal s(t) at different rates, $\{x_1(k)\}$ may be viewed as $s(kT1)$ and $y_1(n)$ may be viewed as $s(nT2)$, as shown in FIG. 1. The conversion ratio $\rho$ of the converter is defined to be equal to $f_2/f_1$.

FIG. 2 is a block diagram of a pulse code modulation (PCM) echo cancellation modem having a pair of forward and inverse analog rate converters as is known in the art. Typically, an encoder/modulator (202) performs at least one of: encoding/modulating local information bearing data bits to provide an input of encoded/modulated sequence (203) to a transmitter filter (204) that provides a digital sequence $x_1(k)$ at a particular sampling frequency $f_1$ with a spectrum suitable for transmission. A forward converter (206) is typically utilized to convert the digital sequence $x_1(k)$ into a digital sequence $y_1(n)$ at a second sampling frequency $f_2$, for example 8 kHz, convenient for transmission over a first PCM circuit to a remote modem (not shown). A received digital sequence $y_2(n)$, at the second sampling frequency $f_2$, that contains a received remote signal from the remote modem and echoes is typically received from a second PCM circuit by an inverse converter (214) of the modem, $y_2(n)$ being synchronous with the transmitted sequence $y_1(n)$. The inverse converter (214) is utilized to convert the received digital sequence $y_2(n)$ into a digital sequence $x_2(k)$ at the first sample frequency $f_1$ and synchronous to $x_1(k)$. The encoder/modulator (202) also provides the encoded/modulated sequence (203) to an echo canceller (208), and an echo canceller (208) output is substantially subtracted from the inverse converter (214) output, typically utilizing a combiner (212) to remove echo components in $x_2(k)$. The combiner output (211), which consists mainly of a received remote signal, is then generally sent to a receiver (210) that recovers remote information bearing data bits transmitted by the remote modem.

FIG. 3 is a block diagram of a typical forward and inverse digital rate converter system that implements analog interpolation as is known in the art. The digital sequence $x_1(k)$ is typically input into a forward converter (302) comprising a first digital-to-analog converter (DAC) (306) having a sampling rate of $f_1$, a first low pass filter (LPF) (308), and a first analog-to-digital converter (ADC) (310) having the sampling rate of $f_2$, to provide an output sequence $y_1(n)$. An inverse converter (304) is utilized to receive the sequence $y_2(n)$, the inverse converter (304) typically comprising a second DAC (316) having a sampling rate of $f_2$, a LPF (314), and a second ADC (312) having a sampling rate of $f_1$.

FIG. 4A is a block diagram of a digital resampler with a linear interpolator adapted for use in the present invention. The operation of such a digital resampler used to implement a first rate converter is described below. It is clear that a second rate converter can also be implemented using such a digital resampler. The following digital resampler is an exemplary embodiment. It is clear that many other digital resamplers would also be suitable for implementing the present invention. A sample shifting unit (402) typically shifts digital samples into a delay line (404A, 404B, ...) having a delay of T, where T is a preselected time that is typically equal to $T_1$, a sample time interval of $x_1(k)$, for the first converter. The sample shifting unit (402) receives a digital sample sequence $\{x_1(k)\}$ at a rate $f_1$ and stores the samples in the delay line. The delay line is operably coupled to a filter bank of subfilters that utilize multiplication elements (406A, 406B, ...) and summation elements (408A, 408B, ...) of selected delayed samples. To generate each sample of a converted sequence $\{y_1(n)\}$ at a rate $f_2$, desired subfilters are selected, and the selected subfilter outputs are input into a linear interpolator (410) that generates the desired sample. In the present invention an exact timing position of each output sample $y_1(n)$ is controlled in three stages. A coarse stage positions the output sample $y_1(n)$ within a full input sample interval $T_1$ of a desired position by shifting the input samples in the delay line. An intermediate stage further positions $y_1(n)$ within $T_1/M$ of the desired position by selecting appropriate subfilters, M being a number of subfilters in the filter bank. A fine stage then utilizes corresponding linear interpolation coefficients to position $y_1(n)$ at the desired timing position within a $T_1/M$ time segment.

To ensure an intermediate stage timing position within $T_1$, the M subfilters in the digital filter bank are designed to have a same magnitude response. The subfilter group delay responses differ from each other by a constant equal to $T_1/M$ over an entire signal frequency range utilized. Thus, output timing positions of any two adjacent subfilters in the filter bank differ by $T_1/M$, the timing offset, provided that the same set of input samples are in the delay line. For a special case in which a first and a last subfilter in the filter bank are adjacent, the timing offset is $T_1(M-1)/M$. In this case, a new sample is shifted into the delay line to compute an output of the subfilter that has a maximum delay, thereby advancing a timing position of the output sample of that filter by a whole $T_1$, and providing that subfilter with a $T_1/M$ lead over the other subfilter. Thus, to generate an output sample at a desired timing position, two subfilters are selected to determine two output samples $y'(n)$ and $y''(n)$ having a timing offset of $T_1/M$, and having timing positions such that the desired timing position of the converter output lies therebetween. The converter output is determined by forming a linear combination of the two selected filter outputs in a form of $\alpha y'(n)+(1-\alpha)y''(n)$, where $\alpha$ and $(1-\alpha)$ are substantially a distance between a timing position of a desired converter output and the timing positions of $y''(n)$ and $y'(n)$, respectively, normalized by $T_1/M$.

The intermediate stage and the fine stage may be viewed as an integrated block of a variable timing offset generator that adjusts timing offsets of digital resampler outputs as is more clearly shown in FIG. 4B, described more particularly below. To change sampling time by more than a whole input sample interval, input samples are shifted into the delay line in addition to changing timing offset. Thus, arbitrary sampling times are achieved, allowing digital rate conversion at any selected ratio. It is clear that the variable timing offset generator used in the present invention may be implemented in many different forms other than the one described above without violating the spirit of this invention.

Figure 4B:
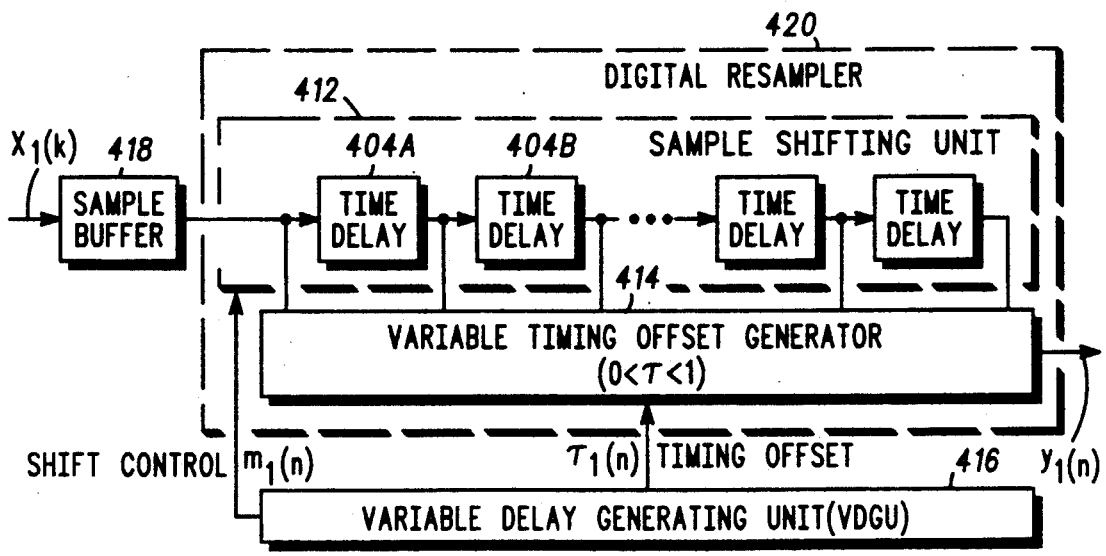
FIG. 4B is a block diagram of an implementation of a digital rate converter in accordance with the present invention wherein a sample shifter is utilized with a variable delay generating unit (VDGU) and a variable timing offset generator.

FIG. 4B is a block diagram of a digital rate converter in accordance with the present invention wherein a sample shifter is utilized with a variable delay generating unit (VDGU) and a variable timing offset generator. A digital resampler (420) is implemented as a first sample shifting unit (412) utilized with a variable timing offset generator (414). A desired normalized timing offset $\tau_1(n)$ and a shifting control signal $m_1(n)$ are supplied to the digital resampler (420) by a variable delay generating unit (VDGU)(416) that is more fully described below. A second digital rate converter is implemented in an inverse manner, similar to that of the first utilized digital rate converter so that at least a first rate converter and a second digital rate converter are used for full implementation of the invention. Detailed operation of the first rate converter is as follows: a first digital sequence $x_1(k)$ is input into a sample buffer (418) In accordance with the first variable delay generating unit (416), the samples in the buffer (418) are shifted into the data shifter (412) that has a delay line with T delay, where T is a preselected time that is equal to $T_1$, the sample time interval of $x_1(k)$ for the first digital rate converter. For each output digital sample $y_1(n)$, the sampling time is advanced by a certain amount, $\Delta\tau_1(n)$, with respect to the sampling time of the previous sample $y_1(n-1)$. The first sampling time advance $\Delta\tau_1(n)$ may be supplied by an external control device, or alternatively, simply computed as $\Delta\tau_1(n)=1/\rho$, where $\rho$ is a nominal rate-conversion ratio of the first digital rate converter. The first VDGU (416) determines a shifting control signal $m_1(n)$ that is an integer part of $\Delta\tau_1(n)+\Delta\tau_1(n-1)$, where $\tau_1(n-1)$ is a normalized timing offset of $y_1(n-1)$, and is supplied to the sample shifter (412) for shifting $m_1(n)$ samples into the delay line, and determines a desired normalized timing offset $\tau_1(n)$, where $0<\tau_1(n)<1$, that is the fractional part of $\Delta\tau_1(n)+\tau_1(n-1)$ and is supplied to the variable timing offset generator (414) for generating the first output digital sequence sample of $y_1(n)$. The first VDGU (416) then stores the normalized timing offset $\tau_1(n)$ for use in generating the $(n+1)$th sample $y_1(n+1)$.

Figure 5:
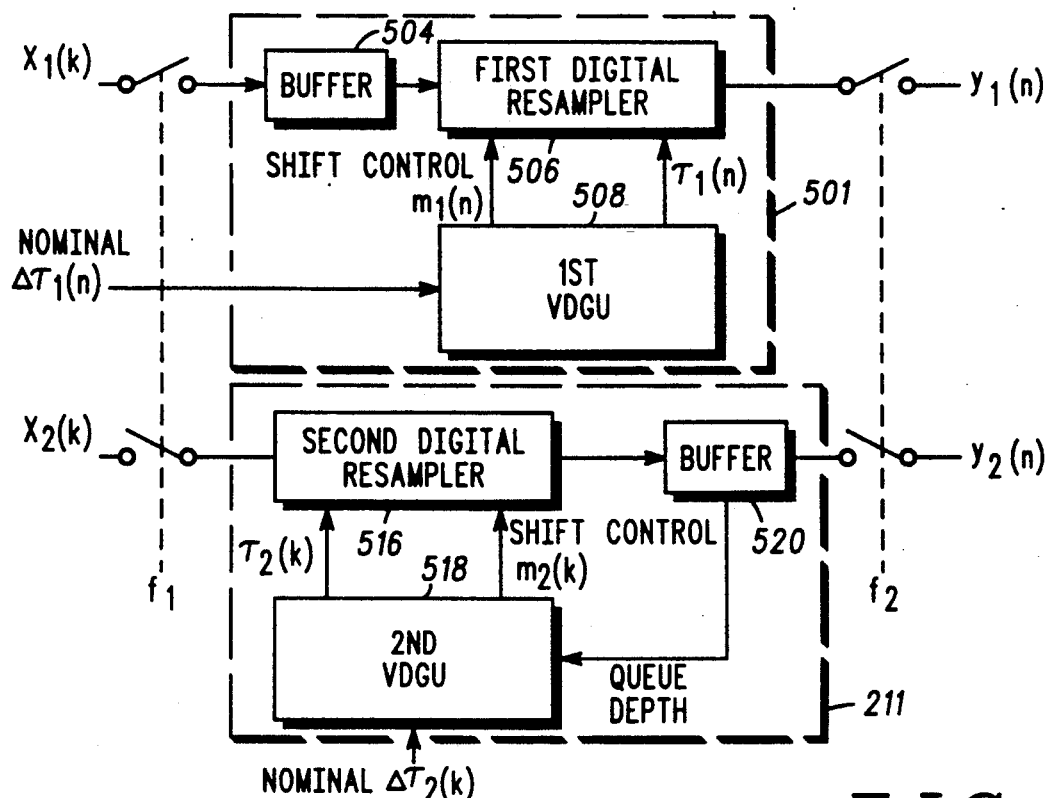
FIG. 5 is a block diagram of a first exemplary implementation of a device in accordance with the present invention including operably coupling at least the second buffer with a second VDGU for at least queue-depth monitoring.

FIG. 5 is a block diagram of a first exemplary implementation of a device in accordance with the present invention including operably coupling at least the second buffer with a second VDGU for at least queue-depth monitoring. A digital synchronization device is provided for at least partially synchronizing at least first (501) and second (511) digital rate converters (DRCs). Typically, the first DRC (501) is operated at a nominal rate-conversion ratio of $\rho$. Generally, the first DRC (501) has at least an input of some first digital sequence samples $\{x_1(k)\}$ sampled at a first sampling rate and the second DRC (511) has at least an input of some second digital sequence samples $\{y_2(n)\}$ that are related to the first digital sequence samples and are sampled at a second sampling rate different from the first sampling rate. In one embodiment, the first DRC (501) comprises at least: a first buffer (BUFFER 1)(504), operably coupled to receive the first digital sequence samples $\{x_1(k)\}$, for delaying and temporarily storing the first digital sequence samples $\{x_1(k)\}$; a first digital resampler (506) having at least a first delay unit, operably coupled to the first buffer (504), for shifting the first digital sequence samples into the first delay unit and for generating first output digital sequence samples $\{y_1(n)\}$ at substantially the second sampling rate utilizing a first selected sample timing in accordance with a first shift control signal $m_1(n)$ and a first desired normalized timing offset $\tau_1(n)$; and a first variable delay generating unit (FIRST VDGU)(508) having a nominal normalized timing input $\Delta\tau_1(n)$, $\Delta\tau_1(n)$ being a first sampling time advance, and being operably coupled to the first digital resampler (506), for providing the first desired normalized timing offset $\tau_1(n)$ and for providing the first shift control signal $m_1(n)$ determined from a previous normalized timing offset $\tau_1(n-1)$. A first sampling time advance $\Delta\tau_1(n)$ may be preselected by an external controller, or alternatively, may be determined from a nominal conversion ratio $\rho$ such that $\Delta\tau_1(n)=1/\rho$. The second DRC (511) comprises at least: the second buffer (520), operably coupled to receive the second digital sequence samples $\{y_2(n)\}$ related to the first digital sequence samples $\{x_1(k)\}$, for delaying and temporarily storing the second digital sequence samples $\{y_2(n)\}$ and for providing a feedback signal to a second variable delay generating unit (SECOND VDGU)(518); a second digital resampler (516) having at least a second delay unit, operably coupled to the second buffer (520) and to the second variable delay generating unit (SECOND VDGU)(518), for shifting the second digital sequence samples into the second delay unit and for generating second output digital sequence samples $\{x_2(n)\}$ at substantially the first sampling rate utilizing a selected sample timing in accordance with a second desirable normalized timing offset $\tau_2(k)$ and a second shifting control signal from the second variable delay generating unit (SECOND VDGU)(518), the second variable delay generating unit (SECOND VDGU)(518) having a nominal normalized timing input $\Delta\tau_2(k)$, $\Delta\tau_2(k)$ being a second sampling time advance, and being operably coupled to the second digital resampler (516), providing the second desired normalized timing offset $\tau_2(k)$ and for providing the second shift control signal $m_2(n)$ determined from a previous normalized timing offset $\tau_2(n-1)$, the second variable delay generating unit being operably coupled at least to the second digital resampler, for providing shift and timing information in accordance with a second sampling time advance $\Delta\tau_2(k)$, such that timing differences between the first digital sequence samples and the second output digital sequence samples are substantially detected and variations in the timing differences are substantially reduced. $\Delta\tau_2(k)$ is typically substantially set to $\Delta\tau_2(k)=\rho$, or alternatively, $\Delta\tau_2(k)=\rho^2\Delta\tau_1(n)$. Due to utilization of a feedback signal, further described below, then timing differences between the first digital sequence samples and the second output digital sequence samples are minimized. In the implementation illustrated in FIG. 5, feedback is utilized from the second buffer (520). However, it is clear that feedback may alternatively be obtained from an output buffer of the second DRC (511) as described more fully below.

In one embodiment, further including one of: the second buffer (520) being operably coupled to the second variable generating unit (518) and an output buffer of the second DRC being operably coupled to the second variable delay generating unit, queue-monitoring feedback is provided for shifting and timing offset information to the second digital resampler (516) that may be selected to include include queue monitoring of a depth of at least one of: an input buffer of the second digital sequence samples $\{y_2(n)\}$ and an output buffer of the second output digital sequence $\{x_2(k)\}$. Typically, for a desired queue-depth D and a selected buffer being one of: the input buffer of $\{y_2(n)\}$ and the output buffer of $x_2(k)$, the second variable delay generating unit further provides for: where the queue depth of the selected output buffer is greater than D, generating the second output digital sequence samples $\{x_2(k)\}$ at a rate smaller than the first sampling rate; where the queue depth of the selected output buffer is less than D, generating the second output digital sequence samples $\{x_2(k)\}$ at a rate greater than the first sampling rate; where the queue depth of the selected input buffer is greater than D, generating the second output digital sequence samples $\{x_2(k)\}$ at a rate greater than the first sampling rate; and where the queue depth of the selected input buffer is less than D, generating the second output digital sequence samples $\{x_2(k)\}$ at a rate smaller than the first sampling rate. Queue monitoring thus provides that the conversion ratio of the second digital resampler (516) is, on an average, equal to a reciprocal of the conversion ratio of the first digital resampler (508) and limits an instantaneous timing variation to no more than the larger of $T_1$ and $T_2$, where $T_1$ and $T_2$ are as defined for FIG. 1, and provides for synchronization of the first and second rate converters.

Certain applications require more precise synchronization of first and second rate converters than that in the queue-depth monitoring described above. The device and method of the present invention also provides for selection of a more precise synchronization, where desired, set forth in FIG. 6 and described more fully below. This synchronization enhances conventional digital rate converters by allowing direct accessing and adjustment of rate converters.

Figure 6:
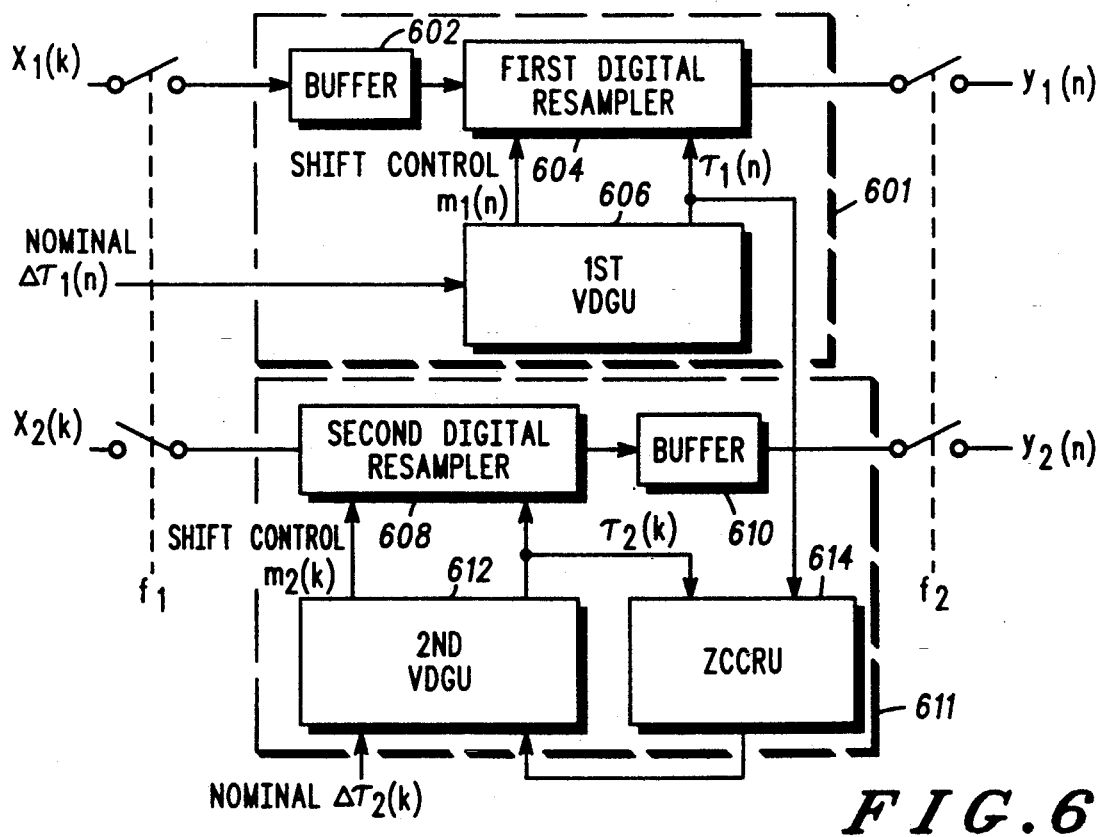
FIG. 6 is a block diagram of a best mode exemplary implementation of a device in accordance with the present invention including at least a first zero-crossing checking and resetting unit.

In a best mode exemplary embodiment, FIG. 6, a device in accordance with the present invention includes at least a first zero-crossing checking and resetting unit (614). Again, the device provides for at least partially synchronizing at least first and second digital rate converters (DRCs), the first DRC having an input of at least some first digital sequence samples $\{x_1(k)\}$ sampled at a first sampling rate and the second DRC having an input of at least some second digital sequence samples $\{y_2(n)\}$ related to the first digital sequence samples and sampled at a second sampling rate different from the first sampling rate. Typically the first digital rate converter (601) has a first conversion ratio of $\rho$ that is utilized to perform rate conversion, and a second converter (611) is utilized to perform second rate conversion. In this embodiment, the first digital rate converter (601) comprises: a first buffer (FIRST BUFFER)(602), operably coupled to receive the first digital sequence samples $\{x_1(k)\}$, for delaying and temporarily storing the first digital sequence samples $\{x_1(k)\}$; a first digital resampler (604), operably coupled to the first buffer (602) for shifting the first digital sequence samples into the first delay unit and for generating first output digital sequence samples $\{y_1(n)\}$ at substantially the second sampling rate utilizing a first selected sample timing in accordance with a first shift control signal $m_1(n)$ and a first desired normalized timing offset $\tau_1(n)$; and a first variable delay generating unit (FIRST VDGU)(606) having a nominal normalized timing input $\Delta\tau_1(n)$, $\Delta\tau_1(n)$ being a first sampling time advance, and being operably coupled to the first digital resampler (604) and to a zero-crossing checking and resetting unit (614), for providing the first desired normalized timing offset $\tau_1(n)$ and for providing the first shift control signal $m_1(n)$ determined from a previous normalized timing offset $\tau_1(n-1)$. A first sampling time advance $\Delta\tau_1(n)$ may be preselected by an external controller, or alternatively, may be determined from a nominal conversion ratio $\rho$ such that $\Delta\tau_1(n)=1/\rho$. The second digital rate converter (611), being the second DRC, comprises at least: the second buffer (610), operably coupled to receive the second digital sequence samples $\{y_2(n)\}$ from the first digital resampler (604) that are related to the first digital sequence samples; a second digital resampler (608), operably coupled to the second buffer (610), to a second variable delay generating unit (SECOND VDGU)(612), and to provide second output digital sequence samples; the zero-crossing checking and resetting unit (614) being operably coupled to the FIRST VDGU (606) and to the SECOND VDGU (612); and the SECOND VDGU (612) being operably coupled to the second digital resampler (608) and to the zero-crossing checking and resetting unit (ZCCRU)(614). The functions of the buffers, the resamplers and the VDGUs are similar to the functions of the corresponding elements described in the previous embodiment using queue-monitoring and feedback. However, the ZCCRU (614) is utilized instead of queue-monitoring and feedback to achieve a more precise synchronization between the first and second digital rate converters.

In the best mode implementation, the first converter (601) is initialized to a normalized timing offset of $\tau_1(0)=\tau_{init}$, and the second digital rate converter (611) is initialized to a normalized timing offset of $\tau_2(0)=(1-\rho\tau_{init})$ modulo 1. To simplify description of the implementation, but without loss of generality, assuming $\tau_{init}=0$, that is, $\tau_1(0)=0$ and $\tau_2(0)=0$ in the sequel. Advances in sample timing $\Delta\tau_1(n)$ of the first converter (601) are typically provided by an outside controller, or alternatively, determined as $\Delta\tau_1(n)=1/\rho$, with sample timing of the second digital rate converter (611) being advanced according to one of: the nominal conversion ratio such that $\Delta\tau_2(k)=\rho$ and the advance value of the sampling time advance of the first converter output sample $y_1(n)$, such that $\Delta\tau_2(k)=\rho^2\Delta\tau_1(n)$, where n is a current time index of the first converter output samples that does not necessarily have a one-to-one correspondence for every k. For every n, the FIRST VDGU (606) determines a shift control signal $m_1(n)$ and determines a normalized timing offset $\tau_1(n)$ from each $\Delta\tau_1(n)$ as described above. Generally, where n increases, the normalized timing offset $\tau_1(n)$ monotonically increases for $\rho<1$ and decreases for $\rho>1$, in a range of 0 to 1. However, there are two special cases for the present invention. In a first special case, at n, where $\rho<1$ and $\tau_1(n-1)$ is a large value that is close to one, at n the FIRST VDGU (606) generates a value of $\tau_1(n)$ that is less than $\tau_1(n-1)$ and is close to zero. This first special case is defined to be a zero-crossing from one-side, and an additional shift signal is sent to the first digital resampler (604) to shift one more sample $x_1(k)$ into the first delay unit. In a second special case, at n, where $\rho>1$ and $\tau_1(n-1)$ is a small value that is close to zero, the FIRST VDGU (606) generates a value of $\tau_1(n)$ that is greater than $\tau_1(n-1)$ and is close to one. This second special case is defined to be a zero-crossing from the zero-side, and the FIRST VDGU (606) transmits a signal to the first digital resampler (604) to shift one less sample into the first delay unit than would generally be shifted.

In a first example, where a first converter has a rate-conversion ratio that is a rational number, for example, for $\rho=f_2/f_1=10/9$, a normal timing advance for the first DRC is equal to $\Delta\tau_1(n)=1/\rho=0.9$. As described above, an integer $m_1(n)$ and a fractional number $\tau_1(n)$ are determined by the FIRST VDGU and are transmitted to the first digital resampler for generating the nth output sample $y_1(n)$. For an initial normalized timing offset $\tau_1(0)=0$, consecutive offsets and corresponding required input delay unit shifts are: $\tau_1(1)=0.9$, $m_1(1)=0$; $\tau_1(2)=0.8$, $m_1(2)=1$; $\tau_1(3)=0.7$, $m_1(3)=1$; $\tau_1(4)=0.6$, $m_1(4)=1$; . . . ; $\tau_1(9)=0.1$, $m_1(9)=1$; $\tau_1(10)=0$, $m_1(10)=1$; and $\tau_1(11)=0.9$, $m_1(11)=0$. Thus, where a conversion ratio $\tau>1$, the time-offset is decreasing by $(1-1/\rho)=(\rho-1)/\rho$ for each output sample in a modulo 1 fashion, and the input delay unit generally shifts by one position. However, for n=11, where a modulo 1 operation occurs, that is where $\tau_1(n-1)$ is a small value that is close to zero and $\tau_1(n)$ is close to one, the input delay unit remains unchanged from an (n−1)th output sample to an nth output sample. This describes zero-crossing from the zero-side. FIG. 7A illustrates sample-timing change and offset as in this first sample where a zero-crossing from the zero-side occurs.

In a second example, for a rational conversion ratio $\rho=9/10$, a normal timing advance $1/\rho=10/9$, and an initial normalized timing offset starting from $\tau_1(0)=0$, consecutive offsets and corresponding required input delay unit shifts are: $\tau_1(1)=0.111\ldots$, $m_1(1)=1$; $\tau_1(2)=0.222\ldots$, $m_1(2)=1$; $\tau_1(3)=0.333\ldots$, $m_1(3)=1$; $\tau_1(4)=0.444\ldots$, $m_1(4)=1$; . . . ; $\tau_1(8)=0.888\ldots$, $m_1(8)=1$; $\tau_1(9)=0$, $m_1(9)=2$; and $\tau_1(10)=0.111\ldots$, $m_1(10)=1$. $m_1(n)$ is defined as an integer part of $\tau_1(n-1)+1/\tau$ and $\tau_1(n)$ is its fractional part with $0<\tau_1(n)<1$. Thus, where the conversion ratio $\rho$ is less than one, the time offset increases by $(1/\rho-1)$ for every output sample, also in a modulo 1 fashion, and the input delay unit generally shifts by one position. However, for n=9, where a modulo 1 operation occurs, that is where $\tau_1(n-1)$ is close to one and $\tau_1(n)$ is close to zero, the input delay unit shifts by two positions from an (n−1)th output sample to an nth output sample. This describes zero-crossing from the one-side. FIG. 7B illustrates sample-timing change and offset as in this second example where a zero-crossing from the one-side occurs.

Figure 8A:
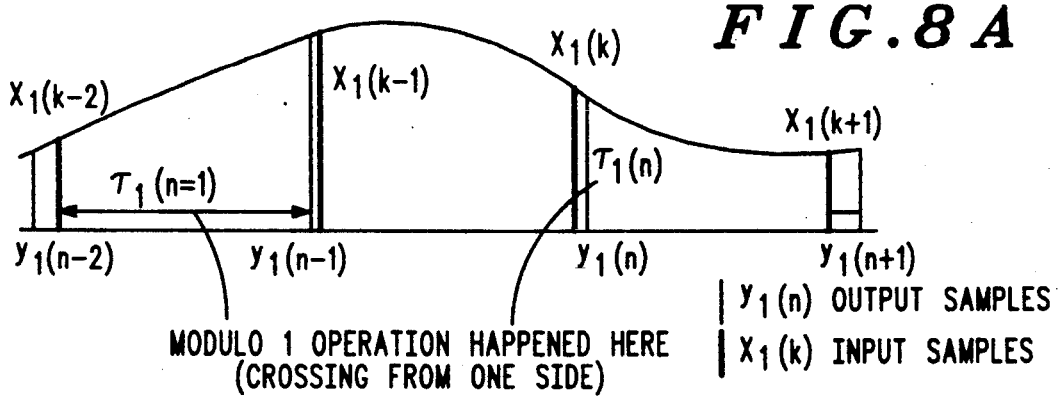
FIG. 8A and 8B are second timing diagrams substantially depicting exemplary timing offset during zero-crossings for general rate converter frequency ratios, 8A depicting zero crossing from one side, 8B depicting zero crossing from zero side, respectively, wherein the method and device of the present invention are utilized.
Figure 8B:
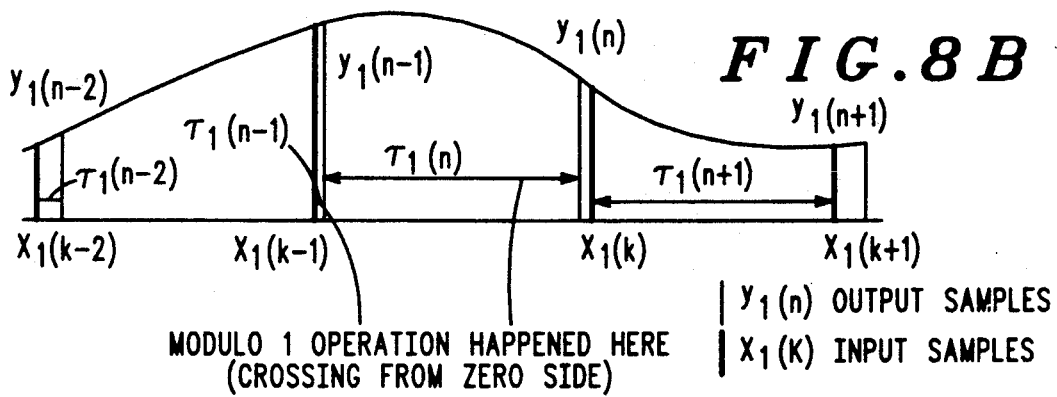

FIG. 8A and 8B are another set of timing diagrams substantially depicting exemplary normalized timing offset during zero-crossings for irrational conversion ratios, 8A depicting zero-crossing from the one-side, and 8B depicting zero-crossing from the zero-side, respectively, wherein the method and device of the present invention are utilized.

According to this invention, the ZCCRU (614) utilizes the above two cited special cases by detection of the zero-crossing and performing resetting of the second rate converter (611) to achieve a more precise synchronization.

The function of the ZCCRU (614) is further described as follows: as a zero crossing occurs in the first DRC (601), a zero crossing of an opposite type must also occur in the second DRC (602) for the time index increasing from k−1 to k. Denoting a normalized timing offset of the first converter by $\tau_1(n)$, the normalized timing offset of the second DRC (611) is set to be $1-\rho\tau_1(n)$, where $\tau_1(n)$ is close to zero, that is, zero-crossing from the one-side, the normalized timing offset of the second DRC (611) is set to be $\rho[1-\tau_1(n)]$ where $\tau_1(n)$ is close to one, that is, zero-crossing from the zero-side, and the number of output samples generated by the second digital resampler (604) is held equal to the number of input samples that have been shifted into the first delay unit of the first digital resampler (606).

Where $\rho$ is substantially in a neighborhood of one, for example $0.7<\rho<1.4$, but not equal to one, the best mode implementation is easily utilized. However, for $\rho$ very close to one, it is clear that rate converter synchronization necessarily involves some error accumulation. Thus, for maximum benefit, error accumulation for $\rho$ very close to one is generally monitored in this implementation.

Where $\rho$ is outside the suggested range [0.7,1.4], one of the converters may be selected to have a decimator of an integer ratio followed by a rate converter within the suggested range, thus providing for universal synchronization of a pair of first and second digital rate converters.

Figure 9:
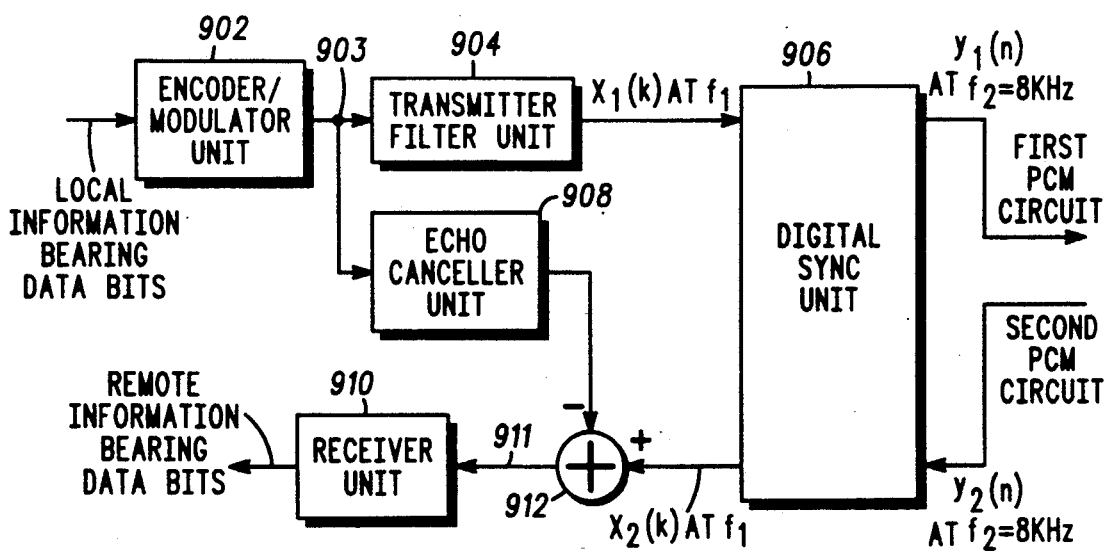
FIG. 9 is a block diagram of an embodiment of a pulse code modulation (PCM) echo cancellation modem having a device in accordance with the present invention.

FIG. 9 is a block diagram of an embodiment of a pulse code modulation (PCM) echo cancellation modem having a device in accordance with the present invention, the device generally being a digital synchronization unit (DIGITAL SYN UNIT) (906) of a form of the digital synchronization device described above. Typically, an encoder/modulator unit (902) performs at least one of: encoding/modulating local information bearing data bits to provide an input of encoded/modulated sequence (903) to a transmitter filter unit (904) that provides a digital sequence $x_1(k)$ at a particular sampling frequency $f_1$ with a spectrum suitable for transmission. A first DRC (not shown) of the digital synchronization unit (DIGITAL SYN UNIT) (906), described above, typically as set forth in one of: FIGS. 5 and 6, is utilized to convert the digital sequence $x_1(k)$ into a digital sequence $y_1(n)$ at a second sampling frequency $f_2$, for example 8 kHz, convenient for transmission over a first PCM circuit to a remote modem (not shown). In the preferred embodiment, the device of FIG. 6 is utilized. A received digital sequence $y_2(n)$, at the second sampling frequency $f_2$, that contains a received remote signal from the remote modem and echoes is typically received from a second PCM circuit by a second DRC (not shown) of the digital synchronization unit (DIGITAL SYN UNIT) (906) of the modem. $y_2(n)$ is typically synchronous with the transmitted sequence $y_1(n)$. The second converter of the digital synchronization unit (DIGITAL SYN UNIT) (906) is utilized to convert the received digital sequence $y_2(n)$ into a digital sequence $x_2(k)$ at the first sample frequency $f_1$ and synchronous to $x_1(k)$. The encoder/modulator (902) also provides the encoded/modulated sequence (903) to an echo canceller unit (908), and an echo canceller unit (903) output is combined with the output of the second DRC of the digital synchronization unit (DIGITAL SYN UNIT) (906), typically utilizing an adder (912) to remove echo components in $x_2(k)$. The adder output (911), which consists mainly of a received remote signal, is then generally sent to a receiver unit (910) that recovers remote information bearing data bits transmitted by the remote modem.

The method of the present invention (not illustrated) provides for at least partial synchronization of at least first and second digital rate converters (DRCs), the first DRC having at least some first digital sequence samples and the second DRC having at least some second digital sequence samples related to the first digital sequence samples, comprising the steps of at least: first converting the first digital sequence samples by: receiving and shifting the first digital sequence samples $\{x_1(k)\}$ to obtain a first delay for each sample; providing a first desired variable timing offset for each first delay such that the first output digital sequence samples $\{y_1(n)\}$ are obtained with first selected sampling times and such that first conversion of the first digital sequence samples is instantaneously measurable at a first instantaneous conversion rate, typically nominal; and converting the second digital sequence samples by: receiving and shifting the second digital sequence samples $\{y_2(n)\}$ related to the first digital sequence samples $\{x_1(k)\}$, for shifting desired second digital sequence samples to obtain a second delay for each sample; providing a second desired variable timing offset for each second delay; and determining second output digital sequence samples $\{x_2(k)\}$ having second selected sampling times; utilizing at least one of feedback and zero-crossing checking and resetting for detecting and reducing timing differences between first digital sequence samples and second output digital sequence samples. Feedback and zero-crossing checking resetting implementations include at least those set forth above for the device of the present invention. Implementation of this method is in accordance with the spirit and scope of the description of the device of the invention.

Although exemplary embodiments are described above, it will be obvious to those skilled in the art that many alternations and modifications may be made without departing from the invention. Accordingly, it is intended that all such alterations and modifications be included within the spirit and scope of the invention as defined in the appended claims.

I claim:

1. A digital synchronization device for at least partially synchronizing at least first and second digital rate converters (DRCs), the first DRC having an input of at least some first digital sequence samples $\{x_1(k)\}$ sampled at a first sampling rate and the second DRC having an input of at least some second digital sequence samples $\{y_2(n)\}$ related to the first digital sequence samples and sampled at a second sampling rate different from the first sampling rate, wherein:

the first DRC comprises at least:
    a first buffer, operably coupled to receive the first digital sequence samples $\{x_1(k)\}$, for delaying and temporarily storing the first digital sequence samples $\{x_1(k)\}$;
    a first digital resampler having at least a first delay unit, operably coupled to the first buffer, for shifting the first digital sequence samples into the first delay unit and for generating first output digital sequence samples $\{y_1(n)\}$ at substantially the second sampling rate utilizing a first selected sample timing in accordance with a first shift control signal $m_1(n)$ and a first desired normalized timing offset $\tau_1(n)$; and a first variable delay generating unit having a normalized timing input $\Delta\tau_1(n)$, $\Delta\tau_1(n)$ being a first sampling time advance, and being operably coupled to the first digital resampler, for providing the first desired normalized timing offset $\tau_1(n)$ and for providing the first shift control signal $m_1(n)$ determined from a previous normalized timing offset $\tau_1(n-1)$; and the second DRC comprises at least:

a second buffer, operably coupled to receive the second digital sequence samples $\{y_2(n)\}$ related to the first digital sequence samples $\{x_1(k)\}$, for at least delaying and temporarily storing the second digital sequence samples $\{y_2(n)\}$ and providing the delayed, temporarily stored samples to a second digital resampler;

a second digital resampler having at least a second delay unit, operably coupled to the second buffer and to a second variable delay generating unit, for shifting the second digital sequence samples into the second delay unit and for generating second output digital sequence samples $\{x_2(n)\}$ at substantially the first sampling rate utilizing a selected sample timing in accordance with a second desirable normalized timing offset $\tau_2(k)$, and a second shifting control signal $m_2(n)$ from the second variable delay generating unit, the second variable delay generating unit having a normalized timing input $\Delta\tau_2(k)$, $\Delta\tau_2(k)$ being a second sampling time advance, and being operably coupled to the second digital resampler, for providing the second desired normalized timing offset $\tau_2(k)$ and for providing the second shift control signal $m_2(n)$ determined from a previous normalized timing offset $\tau_2(n-1)$, the second variable delay generating unit being operably coupled at least to the second digital resampler, for providing shift and timing information in accordance with a second sampling time advance $\Delta\tau_2(k)$, such that timing differences between the first digital sequence samples and the second output digital sequence samples are substantially detected and variations in the timing differences are substantially reduced.

2. The device of claim 1, wherein $\Delta\tau_2(k)$ is substantially equal to $\rho$, where $\rho$ is a nominal rate-conversion ratio.

3. The device of claim 1, wherein $\Delta\tau_2(k)$ is substantially equal to $\rho^2\Delta\tau_1(n)$, where $\rho$ is a nominal rate-conversion ratio.

4. The device of claim 1, wherein the first sampling time advance $\Delta\rho_1(n)$ is preselected by an external controller.

5. The device of claim 1, wherein the first sampling time advance $\Delta\tau_1(n)$ is determined from a conversion ratio $\rho$ such that $\Delta\tau_1(n) = 1/\rho$.

6. The device of claim 1, wherein the first digital resampler further comprises at least a sample shifting unit for providing delayed first digital sequence samples having a first selected rate, a first predetermined number of subfilters, and a linear interpolator for selecting a second predetermined number of subfilter outputs for generating a desired sample.

7. The device of claim 1, further including one of:

the second buffer being further operably coupled to the second variable delay generating unit for providing a first feedback signal for queue-depth monitoring; and an output buffer of the second DRC being operably coupled to the second variable delay generating unit for providing a second feedback signal for queue-depth monitoring;

such that the second variable delay generating unit provides shifting and timing information utilizing at least queue-depth monitoring for monitoring a depth of at least one of:

an output buffer of the second output digital sequence samples $\{x_2(k)\}$, and an input buffer of the second digital sequence samples $\{y_2(n)\}$.

8. The device of claim 7, wherein, for a desired queue-depth D and a selected buffer being one of: the input buffer of $\{y_2(n)\}$ and the output buffer of $x_2(k)$, where the second variable delay generating unit further provides for:

A) where the queue depth of the selected output buffer is greater than D, generating the second output digital sequence samples $\{x_2(k)\}$ at a rate smaller than the first sampling rate;

B) where the queue depth of the selected output buffer is less than D, generating the second output digital sequence samples $\{x_2(k)\}$ at a rate greater than the first sampling rate;

C) where the queue depth of the selected input buffer is greater than D, generating the second output digital sequence samples $\{x_2(k)\}$ at a rate greater than the first sampling rate; and D) where the queue depth of the selected input buffer is less than D, generating the second output digital sequence samples $\{x_2(k)\}$ at a rate smaller than the first sampling rate.

9. The device of claim 1, further including at least a zero-crossing checking and resetting unit, operably coupled to the first variable delay generating unit and to the second variable delay generating unit, for zero-checking the normalized timing offset $\tau_1(n)$, such that, for providing shifting and timing information for a first digital rate converter having a first conversion ratio $\rho$:

the first digital rate converter is initialized to a normalized timing offset of $\tau_{init}$;

the second digital rate converter is initialized to a normalized timing offset of $(1-\rho\tau_{init})$ modulo 1; and where zero-crossing occurs, the zero-crossing checking and resetting unit resets a second normalized timing offset $\tau_2(k)$ to one of:

substantially $1-\rho\tau_1(n)$ where $\tau_1(n)$ is close to zero (crossing from one-side); and substantially $\rho[1-\tau_1(n)]$ where a normalized timing offset $\tau_1(n)$ is near one (crossing from zero side).

10. A modem for at least one of: transmitting and receiving information, such that at least first and second digital rate converters (DRCs) are at least partially synchronized, the first DRC having an input of at least some first digital sequence samples $\{x_1(k)\}$ sampled at a first sampling rate and the second DRC having an input of at least some second digital sequence samples $\{y_2(n)\}$ related to the first digital sequence samples and sampled at a second sampling rate different from the first sampling rate, comprising at least:

A) an encoder/modulator unit, operably coupled to receive information, for at least providing encoded/modulated information;

B) a transmission filter unit, operably coupled to the encoder/modulator unit, for at least filtering the encoded/modulated information to provide first digital sequence samples in a transmission form, $\{x_1(k)\}$;

C) a digital synchronization unit, operably coupled to the transmission filter unit, for providing output samples $\{x_2(k)\}$ at least partially synchronized with $\{x_1(k)\}$, wherein:

the first DRC comprises at least:

a first buffer, operably coupled to receive the first digital sequence samples $\{x_1(k)\}$, for delaying and temporarily storing the first digital sequence samples $\{x_1(k)\}$;

a first digital resampler having at least a first delay unit, operably coupled to the first buffer, for shifting the first digital sequence samples into the first delay unit and for generating first output sequence samples $\{y_1(n)\}$ at substantially the second sampling rate utilizing a first selected sample timing in accordance with a first shift control signal $m_1(n)$ and a first desired normalized timing $\tau_1(n)$; and a first variable delay generating unit having a normalized timing offset input $\Delta\tau_1(n)$, $\Delta\tau_1(n)$ being a first sampling time advance, and being operably coupled to the first digital resampler, for providing the first desired normalized timing offset $\tau_1(n)$ and for providing the first shift control signal $m_1(n)$ determined from a previous normalized timing offset $\tau_1(n-1)$; and the second DRC comprises at least:

a second buffer, operably coupled to receive the second digital sequence samples $\{y_2(n)\}$ related to the first digital sequence samples $\{x_1(k)\}$, for at least delaying and temporarily storing the second digital sequence samples $\{y_2(n)\}$ and providing the delayed, temporarily stored samples to a second digital resampler;

a second digital resampler having at least a second delay unit, operably coupled to the second buffer and to a second variable delay generating unit, for shifting the second digital sequence samples into the second delay unit and for generating second output digital sequence samples $\{x_2(n)\}$ at substantially the first sampling rate utilizing a selected sample timing in accordance with a second desirable normalized timing offset $\tau_2(k)$, and a second shifting control signal $m_2(n)$ from the second variable delay generating unit, the second variable delay generating unit having a normalized timing input $\Delta\tau_2(k)$, $\Delta\tau_2(k)$ being a second sampling time advance, and being operably coupled to the second digital resampler, for providing the second desired normalized timing offset $\tau_2(k)$ and for providing the second shift control signal $m_2(n)$ determined from a previous normalized timing offset $\tau_2(n-1)$, the second variable delay generating unit being operably coupled at least to the second digital resampler, for providing shift and timing information in accordance with a second sampling time advance $\Delta\tau_2(k)$, adjustment to the second variable delay generating unit further being provided by at least one of the following:

a) one of:

the second buffer being further operably coupled to the second variable delay generating unit for providing a first feedback signal for queue-depth monitoring; and an output buffer of the second DRC being operably coupled to the second variable delay generating unit for providing a second feedback signal for queue-depth monitoring;

such that the second variable delay generating unit provides shifting and timing information utilizing at least queue-depth monitoring for monitoring a depth of at least one of:

an output buffer of the second output digital sequence samples $\{x_2(k)\}$, and an input buffer of the second digital sequence samples $\{y_2(n)\}$; and b) at least a zero-crossing checking and resetting unit, operably coupled to the first variable delay generating unit and to the second variable delay generating unit, for zero-checking the normalized timing offset $\tau_1(n)$, such that, for providing shifting and timing information for a first digital rate converter having a first conversion ratio $\rho$:

the first digital rate converter is initialized to a normalized timing offset of $\tau_{init}$;

the second digital rate converter is initialized to a normalized timing offset of $(1-\rho\tau_{init})$modulo 1; and where zero-crossing occurs, the zero-crossing checking and resetting unit resets a second normalized timing offset $\tau_2(k)$ to one of:

substantially $1-\rho\tau_1(n)$ where $\tau_1(n)$ is close to zero (crossing from one-side); and substantially $\rho[1-\tau_1(n)]$ where a normalized timing offset $\tau_1(n)$ is near one (crossing from zero side);

such that timing differences between the first digital sequence samples and the second output digital sequence samples are substantially detected and variations in the timing differences are substantially reduced; and D) a receiver unit, operably coupled to the digital synchronization unit, for at least receiving $\{x_2(k)\}$.

11. The modem of claim 10, further including:

A) an echo canceller unit, operably coupled to the encoder/modulator unit, for at least providing an echo cancelling output; and B) a combiner, operably coupled to the echo canceller unit and to the digital synchronization unit, for substantially adding the echo cancelling output to an output of the digital synchronization unit, such that a substantially echo corrected input is provided to the receiver unit.

12. The modem of claim 10, wherein one of:

$\Delta\tau_2(k)$ is substantially equal to $\rho$, where $\rho$ is a nominal rate-conversion ratio; and $\Delta\tau_2(k)$ is substantially equal to $\rho^2\Delta\tau_1(n)$, where $\rho$ is a nominal rate-conversion ratio.

13. The modem of claim 10, wherein the first sampling time advance $\Delta\tau_1(n)$ is preselected by an external controller.

14. The modem of claim 10, wherein the first sampling time advance $\Delta\tau_1(n)$ is determined from a nominal conversion ratio $\rho$ such that $\Delta\tau_1(n) = 1/\tau$.

15. The modem of claim 10, wherein the first digital resampler further comprises at least a sample shifting unit for providing delayed first digital sequence samples having a first selected rate, a first predetermined number of subfilters, and a linear interpolator for selecting a second predetermined number of subfilter outputs for generating a desired sample.

16. The modem of claim 10, wherein the second variable delay generating unit provides shifting and timing information utilizing at least queue-depth monitoring for monitoring a depth of at least one of: an output buffer of the second output digital sequence samples $\{x_2(k)\}$ and an input buffer of the second digital sequence samples $\{y_2(n)\}$.

17. The modem of claim 10, wherein, for a desired queue-depth D and a selected buffer being one of: the input buffer of $\{y_2(n)\}$ and the output buffer of $x_2(k)$, where the second variable delay generating unit further provides for:
   A) where the queue depth of the selected output buffer is greater than D, generating the second output digital sequence samples $\{x_2(k)\}$ at a rate smaller than the first sampling rate;
   B) where the queue depth of the selected output buffer is less than D, generating the second output digital sequence samples $\{x_2(k)\}$ at a rate greater than the first sampling rate;
   C) where the queue depth of the selected input buffer is greater than D, generating the second output digital sequence samples $\{x_2(k)\}$ at a rate greater than the first sampling rate; and
   D) where the queue depth of the selected input buffer is less than D, generating the second output digital sequence samples $\{x_2(k)\}$ at a rate smaller than the first sampling rate.

18. A method for at least partially synchronizing at least first and second digital rate converters (DRCs), the first DRC having an input of at least some first digital sequence samples $\{x_1(k)\}$ sampled at a first sampling rate and the second DRC having an input of at least some second digital sequence samples $\{y_2(n)\}$ related to the first digital sequence samples and sampled at a second sampling rate different from the first sampling rate, comprising the steps of at least:
   converting the first digital sequence samples by at least the steps of:
      delaying and temporarily storing the first digital sequence samples $\{x_1(k)\}$;
      shifting the first digital sequence samples into a first delay unit and generating first output digital sequence samples $\{y_1(n)\}$ at substantially the second sampling rate utilizing a first selected sample timing in accordance with a first shift control signal $m_1(n)$ and a first desired normalized timing offset $\tau_1(n)$; and
      utilizing a nominal normalized timing input $\Delta\tau_1(n)$, being a first sampling time advance, to provide the first desired normalized timing offset $\tau_1(n)$ and to provide the first shift control signal $m_1(n)$ determined from a previous normalized timing offset $\tau_1(n-1)$; and
   converting the second digital sequence samples by at least the steps of:
      at least delaying and temporarily storing the second digital sequence samples $\{y_2(n)\}$ and providing the delayed, temporarily stored samples to a second digital resampler;
      shifting the second digital sequence samples into the second delay unit and for generating second output digital sequence samples $\{x_2(n)\}$ at substantially the first sampling rate utilizing a selected sample timing in accordance with a second desirable normalized timing offset $\tau_2(k)$, and a second shifting control signal $m_2(n)$;
      utilizing a nominal normalized timing input $\Delta\tau_2(k)$, $\Delta\tau_2(k)$ being a second sampling time advance to provide the second desired normalized timing offset $\tau_2(k)$ and to provide the second shift control signal $m_2(n)$ determined from a previous normalized timing offset $\tau_2(n-1)$, for providing shift and timing information in accordance with a second sampling time advance $\Delta\tau_2(k)$,
   such that timing differences between the first digital sequence samples and the second output digital sequence samples are substantially detected and variations in the timing differences are substantially reduced.

19. The method of claim 18, wherein $\Delta\tau_2(k)$ is substantially equal to $\rho$, where $\rho$ is a nominal rate-conversion ratio.

20. The method of claim 18, wherein $\Delta\tau_2(k)$ is substantially equal to $\rho^2 \Delta\tau_1(n)$, where $\tau$ is a nominal rate-conversion ratio.

21. The method of claim 18, wherein the first sampling time advance $\Delta\tau_1(n)$ is preselected by an external controller.

22. The device of claim 18, wherein the first sampling time advance $\Delta\tau_1(n)$ is determined from a nominal conversion ratio $\rho$ such that $\Delta\tau_1(n) = 1/\rho$.

23. The method of claim 18, further comprising the steps of providing delayed first digital sequence samples having a first selected rate, utilizing a first predetermined number of subfilters, and utilizing at least a linear interpolator for selecting a second predetermined number of subfilter outputs for generating a desired sample.

24. The method of claim 18, further including the step of queue-depth monitoring a depth of at least one of: an output buffer of the second output digital sequence samples $x_2(k)$ and an input buffer of the second digital sequence samples $y_2(n)$.

25. The method of claim 24, further including, for a desired queue-depth D and a selected buffer being one of: the input buffer of $\{y_2(n)\}$ and the output buffer of $\{x_2(k)\}$, where the second variable delay generating unit further provides for:
   A) where the queue depth of the selected output buffer is greater than D, generating the second output digital sequence samples $\{x_2(k)\}$ at a rate smaller than the first sampling rate;
   B) where the queue depth of the selected output buffer is less than D, generating the second output digital sequence samples $\{x_2(k)\}$ at a rate greater than the first sampling rate;
   C) where the queue depth of the selected input buffer is greater than D, generating the second output digital sequence samples $\{x_2(k)\}$ at a rate greater than the first sampling rate; and
   D) where the queue depth of the selected input buffer is less than D, generating the second output digital sequence samples $\{x_2(k)\}$ at a rate smaller than the first sampling rate.

26. The method of claim 18, wherein the steps are utilized in a modem.

27. The method of claim 18, further including the step of zero-checking the normalized timing offset $\tau_1(n)$, such that, for providing shifting and timing information for the first digital rate converter having a first conversion ratio $\rho$:

the first digital rate converter is initialized to a normalized timing offset of $\tau_{init}$;

the second digital rate converter is initialized to a normalized timing offset of $(1-\rho\tau_{init})$ modulo 1; and where zero-crossing occurs, resetting a second normalized timing offset $\tau_2(k)$ to one of:
substantially $1-\rho\tau_1(n)$ where $\tau_1(n)$ is close to zero (crossing from one-side); and
substantially $\rho[1-\tau_1(n)]$ where the normalized timing offset $\tau_1(n)$ is near one (crossing from zero side).

* * * * *

UNITED STATES PATENT AND TRADEMARK OFFICE
CERTIFICATE OF CORRECTION

PATENT NO. : 5,199,046
DATED : March 30, 1993
INVENTOR(S) : Fuyun Ling It is certified that error appears in the above-identified patent and that said Letters Patent is hereby corrected as shown below:

At column 13, line 59, "$\Delta_\rho 1(n)$" should be --$\Delta_\tau 1(n)$--.
At column 17, line 3, "$1/\tau$" should be --$1/\rho$--.
At column 18, line 27, "where $\tau$" should be --where $\rho$--.

Signed and Sealed this

Twenty-third Day of November, 1993

Attest:

BRUCE LEHMAN

Attesting Officer      Commissioner of Patents and Trademarks